United States Patent
Liu et al.

(10) Patent No.: US 9,312,363 B2
(45) Date of Patent: Apr. 12, 2016

(54) MULTI-FIN DEVICE AND METHOD OF MAKING SAME

(71) Applicant: Taiwan Semiconductor Manufacturing Company, Ltd., Hsin-Chu (TW)

(72) Inventors: Chi-Wen Liu, Hsin-Chu (TW);
Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 13/914,202

(22) Filed: Jun. 10, 2013

(65) Prior Publication Data

US 2013/0273705 A1    Oct. 17, 2013

Related U.S. Application Data

(62) Division of application No. 13/223,682, filed on Sep. 1, 2011.

(51) Int. Cl.
| | |
|---|---|
| *H01L 29/76* | (2006.01) |
| *H01L 29/66* | (2006.01) |
| *H01L 21/8234* | (2006.01) |
| *H01L 27/088* | (2006.01) |

(52) U.S. Cl.
CPC .. *H01L 29/66795* (2013.01); *H01L 21/823431* (2013.01); *H01L 27/0886* (2013.01)

(58) Field of Classification Search
CPC ................ H01L 29/66795; H01L 21/823431; H01L 27/0886
USPC .......... 257/316, 324, 401, E27.014; 438/257, 438/287
See application file for complete search history.

(56) References Cited

U.S. PATENT DOCUMENTS

| | | | |
|---|---|---|---|
| 6,376,876 B1 * | 4/2002 | Shin et al. ...................... | 257/315 |
| 6,642,090 B1 * | 11/2003 | Fried et al. ..................... | 438/164 |
| 6,703,661 B2 * | 3/2004 | Wu ................................ | 257/315 |
| 6,757,854 B1 * | 6/2004 | Zhao et al. ..................... | 714/719 |
| 6,787,854 B1 | 9/2004 | Yang et al. | |
| 7,279,375 B2 | 10/2007 | Radosavljevic et al. | |
| 7,381,649 B2 | 6/2008 | Chen et al. | |
| 7,449,373 B2 * | 11/2008 | Doyle et al. ................... | 438/149 |
| 7,479,421 B2 | 1/2009 | Kavalieros et al. | |
| 7,560,785 B2 * | 7/2009 | Yu et al. ......................... | 257/401 |
| 7,564,105 B2 | 7/2009 | Chi et al. | |
| 7,575,975 B2 * | 8/2009 | Thean et al. ................... | 438/275 |
| 7,622,373 B2 | 11/2009 | Zheng et al. | |
| 7,622,765 B2 * | 11/2009 | Kim ...................... | H01L 27/115 257/316 |

(Continued)

FOREIGN PATENT DOCUMENTS

KR       2005-0083305       8/2005

*Primary Examiner* — Bradley K Smith
*Assistant Examiner* — David Goodwin
(74) *Attorney, Agent, or Firm* — Slater & Matsil, L.L.P.

(57) ABSTRACT

A multiple-fin device includes a substrate and a plurality of fins formed on the substrate. Source and drain regions are formed in the respective fins. A dielectric layer is formed on the substrate. The dielectric layer has a first thickness adjacent one side of a first fin and having a second thickness, different from the first thickness, adjacent an opposite side of the fin. A continuous gate structure is formed overlying the plurality of fins, the continuous gate structure being adjacent a top surface of each fin and at least one sidewall surface of at least one fin. By adjusting the dielectric layer thickness, channel width of the resulting device can be fine-tuned.

20 Claims, 8 Drawing Sheets

(56) References Cited

U.S. PATENT DOCUMENTS

| | | |
|---|---|---|
| 7,843,000 B2 | 11/2010 | Yu et al. |
| 7,871,875 B2 | 1/2011 | Kim et al. |
| 8,022,478 B2 | 9/2011 | Anderson et al. |
| 8,098,529 B2 | 1/2012 | Goda |
| 8,174,073 B2 | 5/2012 | Lee et al. |
| 8,193,567 B2 * | 6/2012 | Kavalieros et al. ........... 257/288 |
| 8,405,164 B2 | 3/2013 | Hareland et al. |
| 8,519,481 B2 | 8/2013 | Yuan et al. |
| 2005/0215014 A1 | 9/2005 | Ahn et al. |
| 2005/0224800 A1 | 10/2005 | Lindert et al. |
| 2007/0048934 A1 * | 3/2007 | Kim et al. ..................... 438/254 |
| 2009/0057761 A1 | 3/2009 | Kim et al. |
| 2009/0090976 A1 | 4/2009 | Kavalieros et al. |
| 2009/0209074 A1 * | 8/2009 | Anderson et al. ............. 438/283 |
| 2003/0250769 | 10/2009 | Yu et al. |
| 2009/0250769 A1 * | 10/2009 | Yu et al. ........................ 257/397 |
| 2011/0095378 A1 | 4/2011 | Lee et al. |
| 2011/0147848 A1 * | 6/2011 | Kuhn et al. ................... 257/368 |

\* cited by examiner

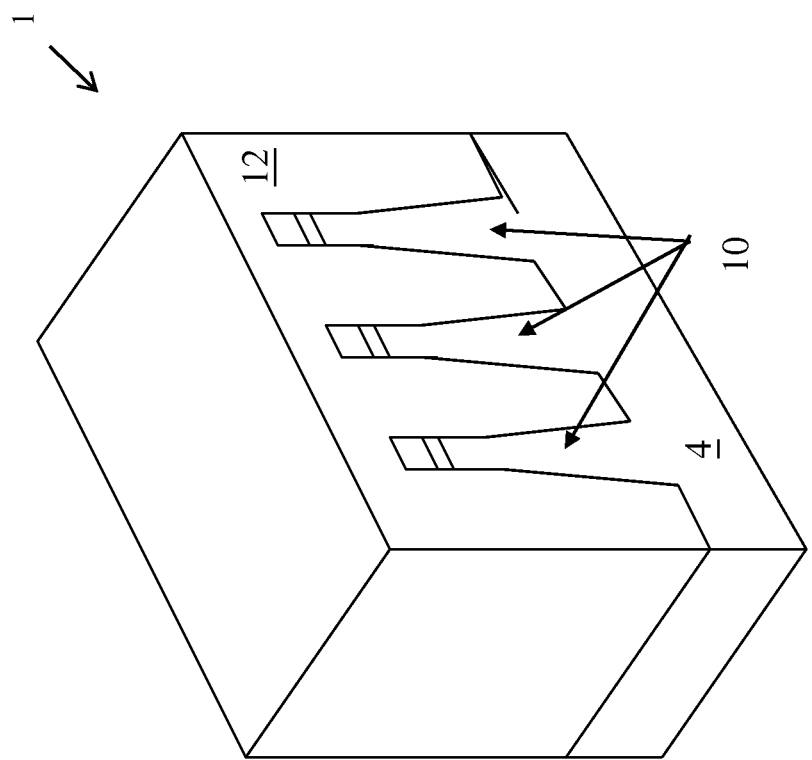
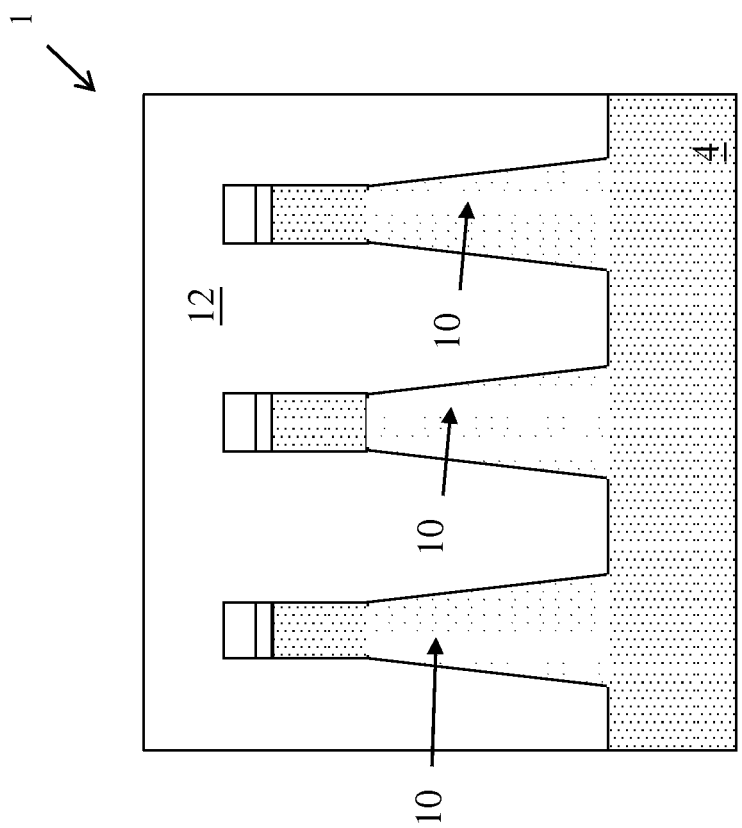
FIG. 3a
FIG. 3b

MULTI-FIN DEVICE AND METHOD OF MAKING SAME

CROSS-REFERENCE TO RELATED APPLICATION

This application is a divisional application of U.S. patent application Ser. No. 13/223,682, filed on Sep. 1, 2011 and entitled "Multi-Fin Device and Method of Making Same," which application is hereby incorporated herein by reference.

BACKGROUND

The so-called Fin field effect transistor (FinFET) device is becoming increasingly popular for high performance, low dimension integrated circuits. Because the gate wraps around the channel region on three sides, FinFETs provide excellent channel control with small critical dimensions. On the other hand, the very nature of the FinFET structure makes it difficult to adjust or tune the channel width of a typical FinFET device. Since various device performance parameters, such as driving current ($I_{Dsat}$) are related to channel width, it is disadvantageous that channel width cannot be readily tuned or adjusted. What is needed then, is a FinFET structure and methods of making same that overcome the shortcomings in the conventional arts.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-6b illustrate various stages in the manufacture of an embodiment 1;

DETAILED DESCRIPTION OF ILLUSTRATIVE EMBODIMENTS

Figure 1A:
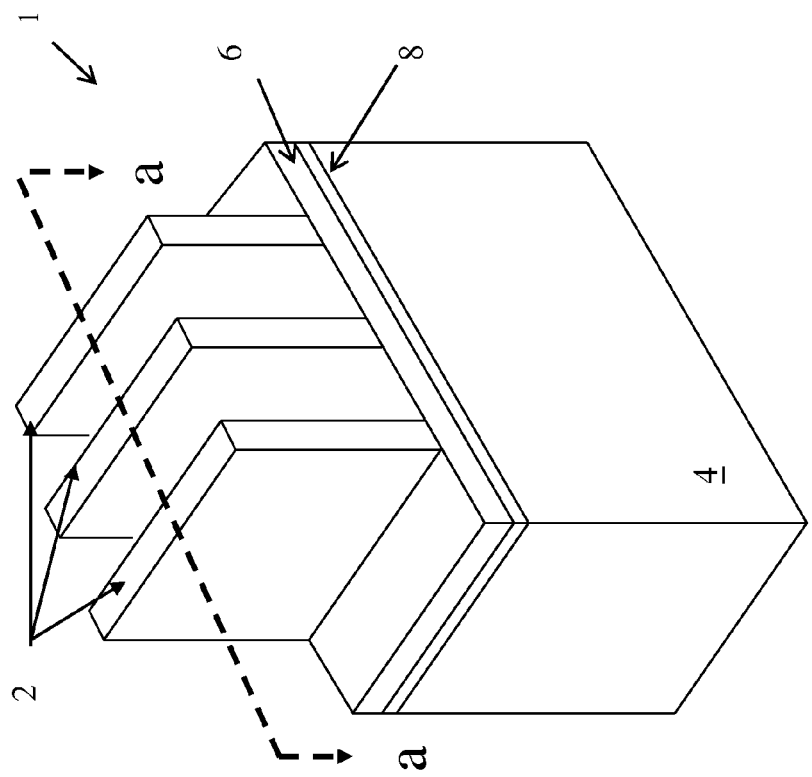
Figure 1B:
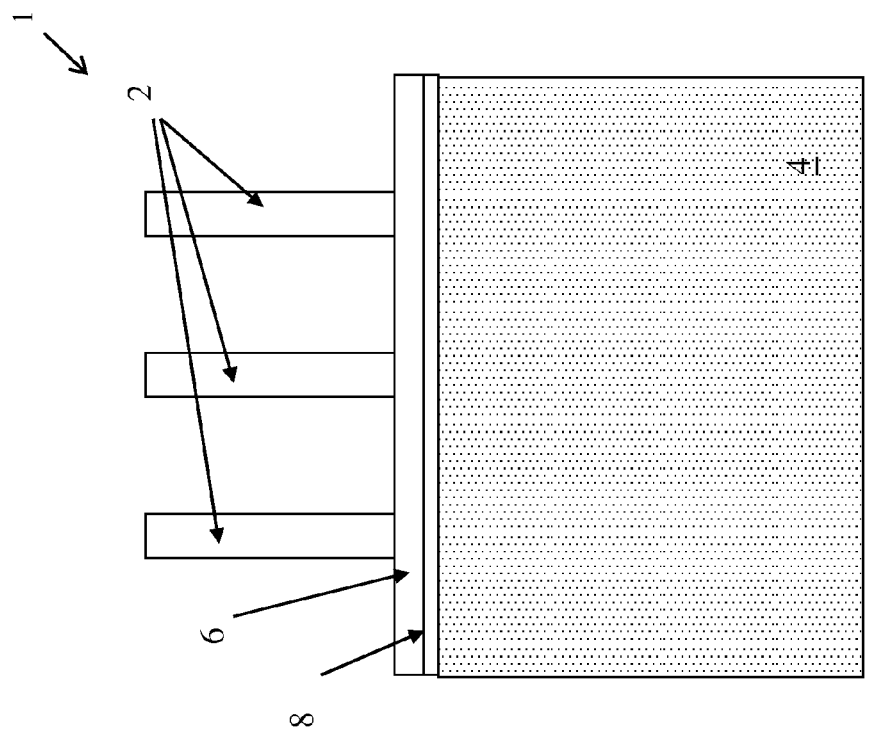

FIG. 1a illustrates, in perspective view, an intermediate stage in the manufacture of a Fin field effect transistor (FinFET) device 1. FIG. 1b illustrates the structure in cross-sectional view along the line indicated as a-a in FIG. 1a. In the illustrated embodiments, FinFET 1 will extend across several fins, and more specifically three fins, as will be explained in greater detail below. In the intermediate stage of manufacture illustrated in FIG. 1a, a patterned photo-sensitive layer 2 has been formed on a substrate 4. More precisely, patterned photo-sensitive layer 4, such as a photoresist or the like, is formed atop hard mask 6, which in turn is atop pad oxide 8, which in turn is atop substrate 4. Hard mask 6 may be silicon nitride, silicon oxynitride, or the like. Pad oxide layer 8 may be silicon oxide and their formations are well known.

Substrate 4 may be a bulk substrate such as a bulk silicon wafer. Alternatively, substrate 4 may be simply a top semiconductor layer of a compound wafer, such as a silicon-on-insulator substrate. In yet other embodiments, substrate 4 may be either a bulk substrate or a top layer of a compound wafer comprising Ge, SiGe, a III-V material such as GaAs, InAs, a II-VI material such as ZeSe, ZnS, and the like, typically epitaxially grown. It is believed the III-V or II-VI materials may be particularly advantageous for forming illustrative devices because of the beneficial strain properties that can be derived from using III-V or II-VI properties, such as InAs, ZnS, and the like.

Figure 2A:
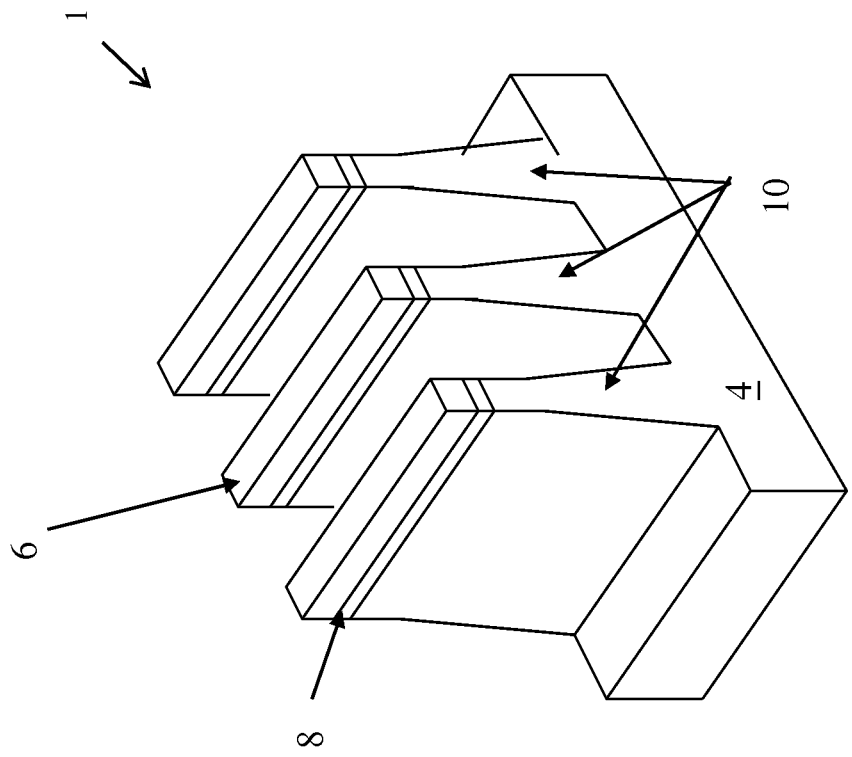
Figure 2B:
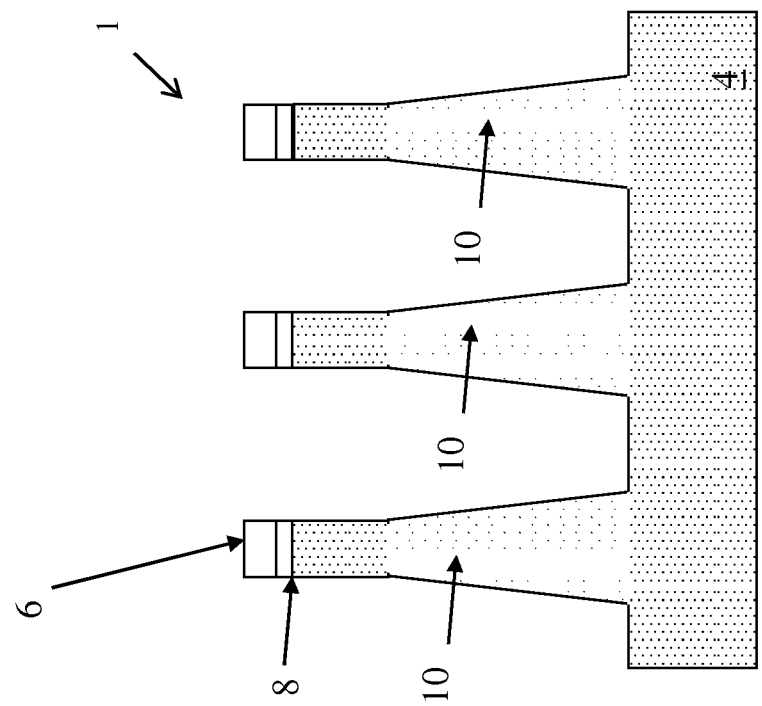

As illustrated in FIGS. 2a and 2b (wherein FIG. 2a continues the perspective view and FIG. 2b continues the cross-sectional view of FIGS. 1a and 1b, respectively), the pattern of patterned photo-sensitive layer 4 is transferred into hard mask 6, pad oxide 8, and substrate 4 using well known etching processes the details of which are not necessary for understanding the invention and hence are not repeated herein. During this pattern transfer process, patterned photo-sensitive layer 2 may be entirely consumed as indicated by FIGS. 2a and 2b. In some embodiments, patterned photo-sensitive layer 2 is not entirely consumed, but rather remaining portions of patterned photo-sensitive layer 2 are removed using, e.g., an oxygen plasma or so-called ash process. The resulting structure includes a plurality of fins 10 formed in substrate 4. Each fin of the plurality of fins 10 has a sidewall, a portion of the sidewall being substantially orthogonal to a major surface of the substrate 4, and a lower portion of the sidewall being non-orthogonal to the major surface of the substrate. These fins 10 serve as the fin structure for the to-be-formed FinFET device 1. In some embodiments substrate 4 is etched to a depth, meaning fins 10 are formed to a height, of from about 40 nm to about 80 nm. In one specific embodiment, fins 10 are formed to a height of about 60 nm.

Turning now to FIG. 3, an oxide layer 12 is blanket deposited on device 1. Oxide layer 12, sometimes referred to as shallow trench isolation oxide or just shallow trench isolation, may be deposited by, e.g., a chemical vapor deposition (CVD) process, by a spin-on-glass process, or the like using process steps that are known to those skilled in the art. Optionally and prior to forming oxide 12, a thermal oxidation of fins 10 may be undertaken to repair damage that occurred to the sidewalls during the etching step (illustrated in FIGS. 2a and 2b).

Figure 4A:
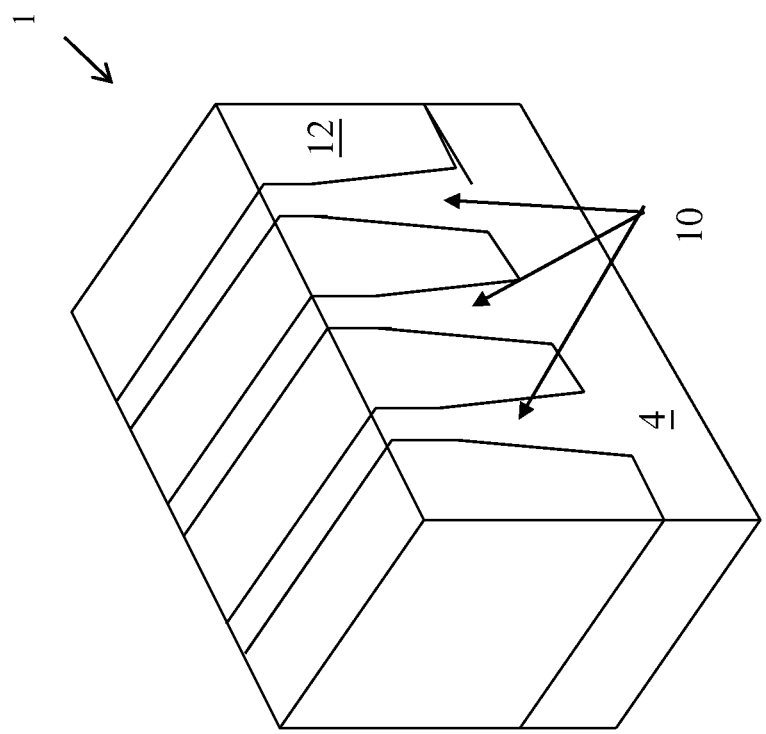
Figure 4B:
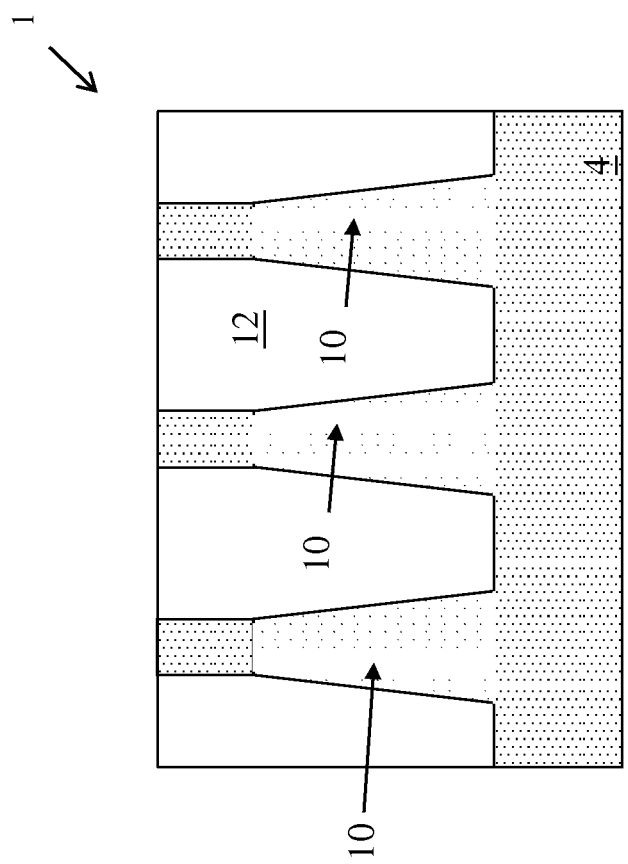

A CMP step is employed to thin oxide layer 12 back to the level of the tops of fins 10, as illustrated in FIGS. 4a and 4b. Note that patterned hard mask 6 and patterned pad oxide 8 are removed in the CMP step. The process parameters for a CMP step are well known in the art and hence are not repeated herein for the sake of brevity and clarity. In some embodiments, after the CMP process, the step of forming a plurality of fins 10 on a substrate 4 may further comprise a process selected from the group consisting essentially of etching fins into a substrate and epitaxially growing fins on a substrate, and combinations thereof. Thus, the plurality of fins may be selected from the group consisting essentially of an epitaxial material, the substrate material, and combinations thereof.

Figure 5A:
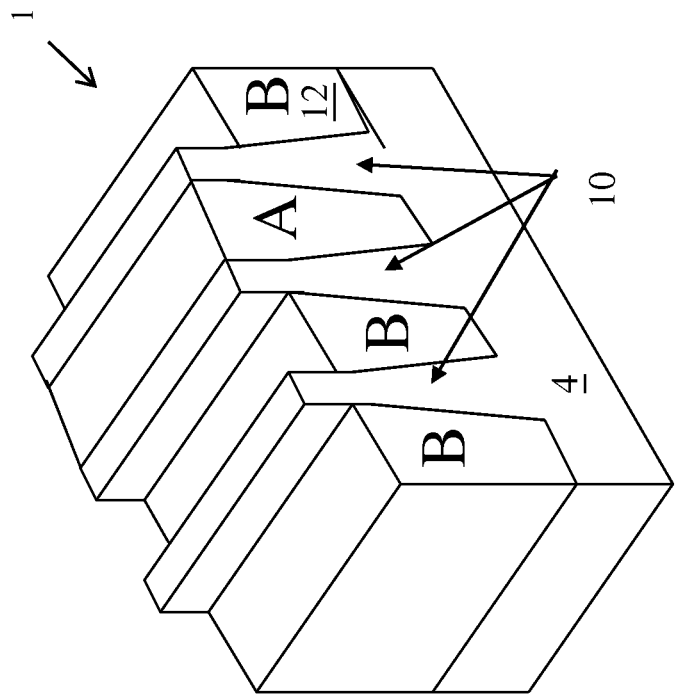

FIG. 5a illustrates the next stage in the manufacturing process, wherein oxide layer 12 is further thinned back. Oxide layer 12 can be thinned back in a variety of ways. In one embodiment, oxide layer 12 is thinned back by a diluted hydrofluoric acid (DHF) treatment or a vapor hydrofluoric acid (VHF) treatment for a suitable time. Note in particular that oxide layer 12 is selectively thinned back, as illustrated by the notations A (indicating portions of oxide layer 12 that have not been thinned back) and B (indicating portions of oxide layer 12 that have been thinned back). This selective thinning can be accomplished by covering portion A of oxide layer 12 with a protective layer, such as a photoresist layer, during the etch back process.

Figure 5B:
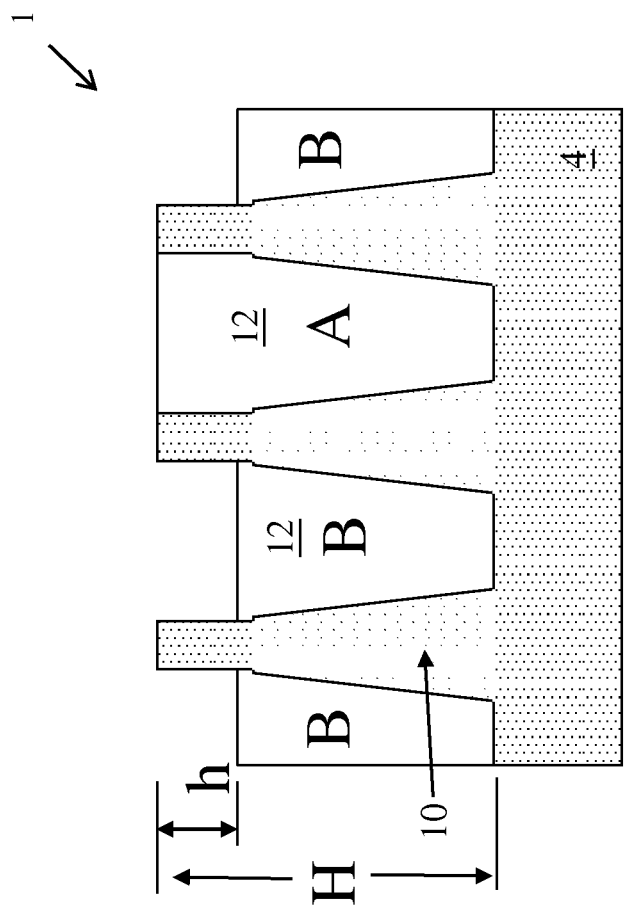

In the embodiment illustrated in FIG. 5b, fin 10 extends a distance H above the surface of substrate 4 and extends a distance h above the thinned back portions B of oxide layer 12. In illustrative embodiments, $1/4 < h/H < 1/3$ for the B regions. It is believed that this ratio of the extension of fins 10 above oxide layer 12 in the B regions provides for a desirable channel width, as will be explained further below.

Figure 6A:
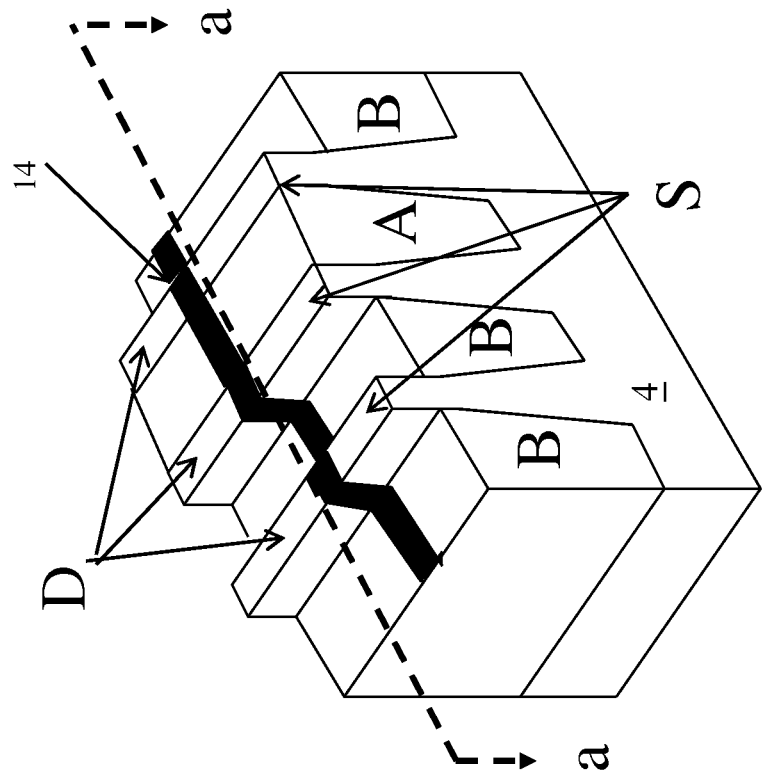
Figure 6B:
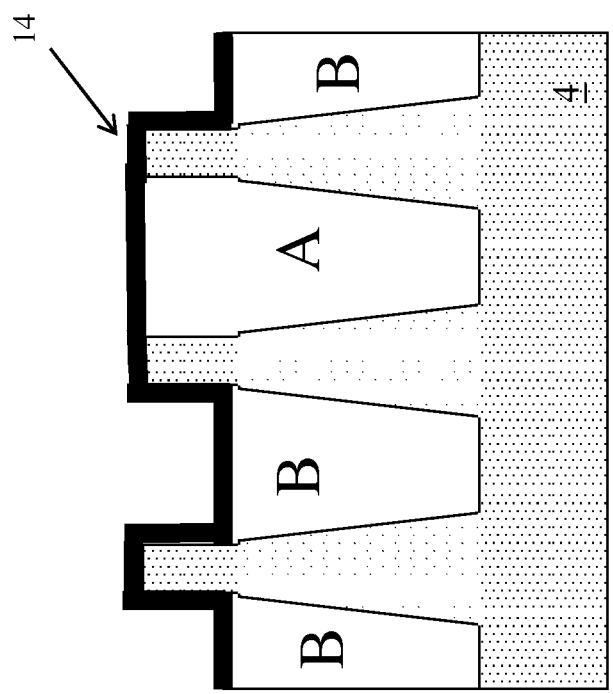

Next, a single continuous gate structure is formed over the three fins 10, as illustrated in FIGS. 6a and 6b. Also illustrated in FIG. 6b is the formation of source regions S and drain regions D within respective fins 10. In one embodiment, forming source and drain regions includes implanting dopants into the respective fins. In another embodiment, forming source and drain regions comprises etching fins into a substrate and epitaxially growing source and drain regions on a substrate. One skilled in the art will recognize the multiple process steps for forming gate structure 14, which includes formation and patterning of a gate dielectric and formation and patterning of a gate electrode. Such details are not necessary for an understanding of the present invention and the gate dielectric and electrode are referred to collectively herein as the gate structure 14. Likewise, the details of forming doped source and drain regions are known and are the details are not repeated herein for the sake of clarity. In this instance, a first metal layer may be continuous and overlying the three source regions to form source region of one finFET device. Further, a second metal layer may be continuous and overlying the three drain regions to form drain region of one finFET device.

Those of skill in the art will recognize that channel length and channel width are two significant parameters for a transistor, including for a finFET device such as illustrative device 1. Channel length is substantially equal to the distance between the source S and drain D regions. In the illustrated embodiment, the use of multiple fins and particularly multiple fins having varying heights as a result of the varying thickness of oxide layer 12 between the fins, has no impact on channel length. In other words, the different oxide layer 12 thicknesses between the fins does not impact the distance between the source S and drain D, or the channel length. Channel length impacts such transistor performance as, e.g., switching speed.

Channel width also impacts device performance, such as the driving current of the device. As an example, $I_{DSAT}$ can be fine-tuned by adjusting the channel width. By varying the thickness of oxide layer 12 between fins, and hence varying the height of fins 10 above the oxide layer, the overall channel width of the resulting finFET can be modified. This is explained in greater detail with regard to FIGS. 6c through 6f.

Figure 6C:
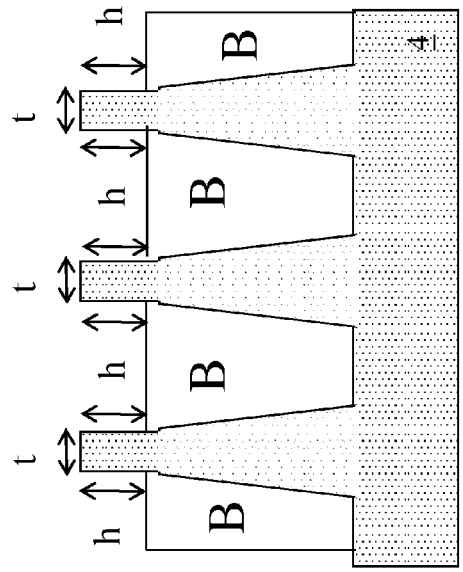
FIGS. 6c-6f illustrate alternative approaches to adjusting dielectric layer thickness in an embodiment.
Figure 6D:
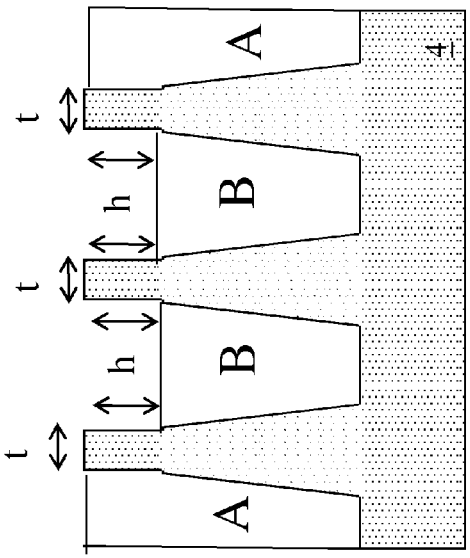

Referring first to FIG. 6c, an end-point embodiment is illustrated in which oxide layer 12 is not etched back at all between fins 10. In this embodiment, the total channel width (after gate structure 14 is formed) will be equal to the thickness t of the fins 10. In this instance, with three fins 10 ganged together to form one finFET device (i.e. with a single gate structure 14 continuous and overlying the three fins 10 such as illustrated in FIG. 6b), the total channel width would be equal to 3t. This structure is effectively equivalent to a planar transistor device. By contrast, FIG. 6d illustrates the other end-point embodiment, in which oxide layer 12 is uniformly etched back between all fins 10. In this embodiment, the total channel width will be equal to the thickness t of each fin plus 2 times the height h of each fin (because the gate structure will overlie both sidewalls of each fin, each having a height h and the top of each fin, having a thickness t). In the illustrated embodiment, the channel width would be equal to 3t+6h. While such a structure might be beneficial in that it is easy to lay out a three fin structure, e.g., in an equivalent area to a planar transistor of similar characteristics, the multiple fin structure might have excessive drive current which can negatively impact desired performance.

Figure 6E:
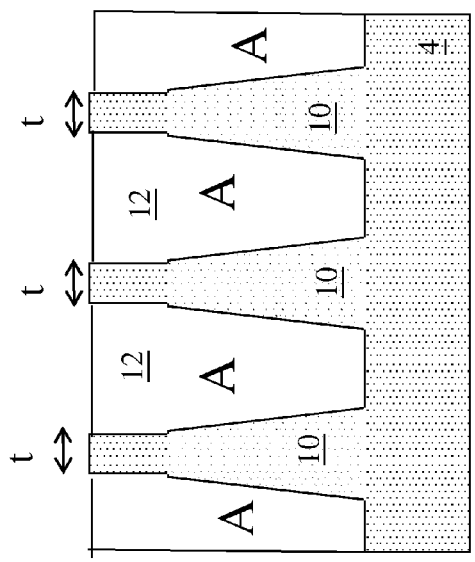

FIG. 6e illustrates another embodiment structure wherein drive current is modified by having oxide layer 12 of varying thickness between the fins. Note that in the embodiment of FIG. 6e, oxide layer 12 is etched back between one pair of fins 10 (the leftmost and center fin), but is not etched back between the other pair of fins 10 (the rightmost and center fin), for example. In this case, the drive current of the resulting structure will be 3t+2h, as only two sidewalls of the fins are exposed for gate structure 14 (not shown, but illustrated in FIG. 6b) to overlie.

Figure 6F:
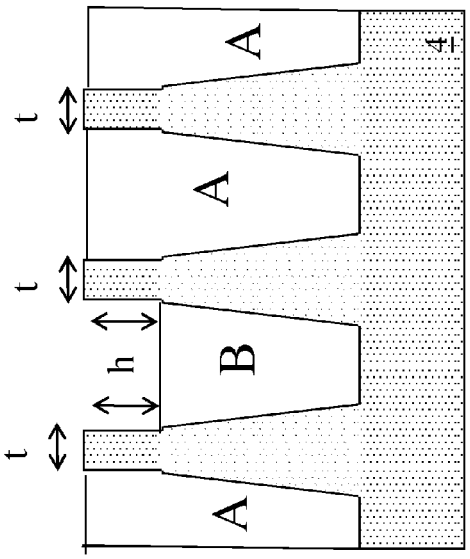

FIG. 6f illustrates yet another embodiment, wherein gate oxide 12 is etched back between both pairs of fins, but not on the outer edges of the outside fins. In this illustrated example, the total channel width is equal to 3t+4h. One skilled in the art will recognize various other configurations that can be employed to fine tune the channel width by adjusting the oxide layer 12 thickness bordering the various fins 10.

Figure 7A:
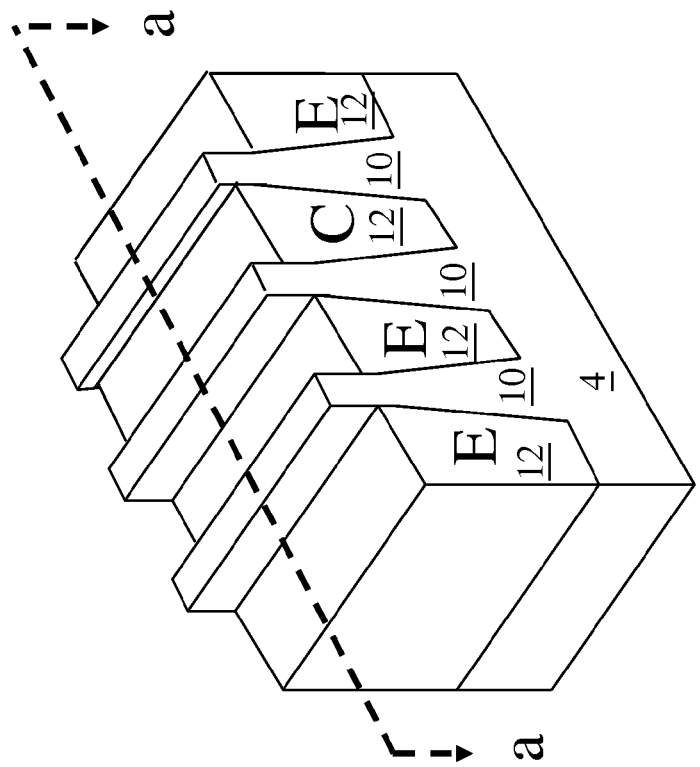
FIGS. 7a-7b illustrate an alternative embodiment of the structure illustrated in FIGS. 6a and 6b, respectively.
Figure 7B:
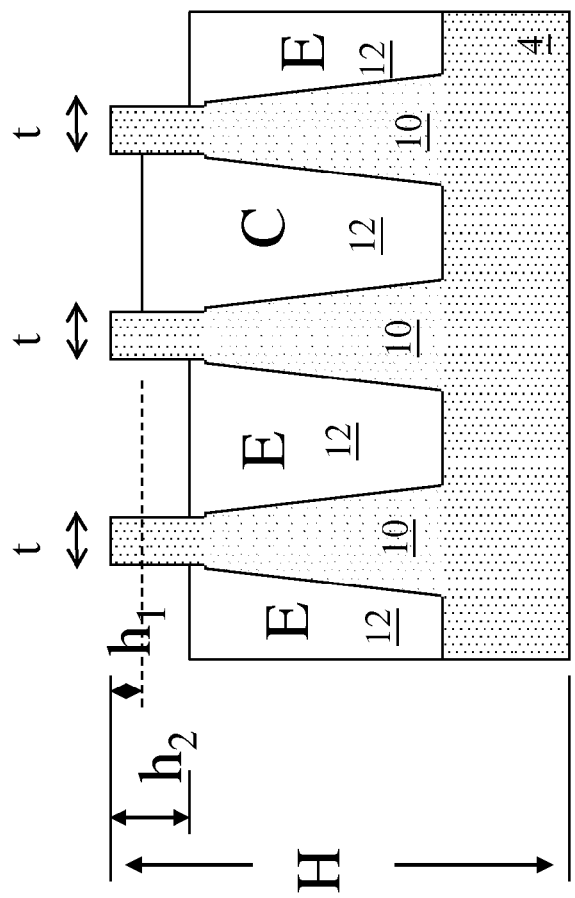

In the embodiments illustrated in FIG. 6 (which includes FIGS. 6a through 6f), oxide layer 12 is either etched is some regions (regions B) or remains totally un-etched in other regions (regions A). In other embodiments, further fine tuning can be obtained by etching back certain regions of oxide layer 12 by a first amount and etching back other regions of oxide layer 12 by a second greater amount. FIGS. 7a and 7b illustrate one such embodiment,.

FIG. 7a illustrates in perspective view and FIG. 7b illustrates in cross sectional view an embodiment in which the portions of oxide layer 12 denoted as C as protected (e.g., covered with a photoresists, a hard mask, a sacrificial layer, or the like) during a first etch back step in which portions of oxide layer 12 denoted as E are partially etched back. In a next process step, portions C are exposed and oxide layer 12, including portions C and E, is further etched back to the levels shown in FIGS. 7a and 7b. In this case, the left most fin 10 extends a height of $h_2$ above oxide layer 12 whereas the two rightmost fins extend a height $h_2$ above oxide layer 12 on their respective outer sidewalls (because oxide layer 12 is at a thickness of "E" on the outer regions of the fins) and extend a lesser height of $h_1$ above oxide layer 12, having a thickness of "C" along their respective inner sidewalls. Assuming fins 10 have a thickness of t, the total channel width for the embodiment illustrated in FIG. 7 is $3t+4h_2+2h_1$.

Although the present embodiments and their advantages have been described in detail, it should be understood that various changes, substitutions and alterations can be made herein without departing from the spirit and scope of the disclosure as defined by the appended claims. As but a few examples, although a finFET device extending across three fins is shown, the teachings of the present disclosure would apply equally to a finFET extending across two fins, or extending across four or more finds. Likewise, other multi-gate devices, such as w-gate devices, omega-gate devices, and the like are within the contemplated scope. Additionally, even further fine tuning of channel length can be obtained by extending the above described two etch back process (FIG. 7) to a three etch back process wherein oxide layer 12 could be three different heights, resulting in fins with up to three different sidewall fin heights. This teaching could be further extending to four or more different oxide layer thicknesses by adding additional etch back and masking steps. It is important to note that the present teaching would apply equally to fins that are epitaxially grown as it does to fins that are etched into a substrate.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device comprising:
   forming a plurality of fins on a substrate;
   forming source and drain regions in each of the plurality of fins;
   forming a dielectric layer comprising a first portion, a second portion and a third portion between the fins;
   adjusting a thickness of the dielectric layer between at least two of the plurality of fins;
   forming a continuous gate structure on the fins and dielectric layer; and
   forming a continuous first metal layer overlying the source regions of the plurality of fins, thereby forming a source region of a single finFET device, the single finFET device comprising the plurality of fins, the continuous first metal layer and the continuous gate structure;
   wherein, after the forming the continuous gate structure, the first portion is between first and second fins of the plurality of fins and has a top surface about level with top surfaces of the first and second fins;
   wherein, after the forming the continuous gate structure, the second portion is between the second fin and a third fin of the plurality of fins and has a top surface below the top surface of the second fin;
   wherein, after the forming the continuous gate structure, the third portion is adjacent the third fin opposite the second portion and has a top surface about level with top surfaces of the third fin; and
   wherein the continuous gate structure is configured to simultaneously control operation of each of the plurality of fins in the single FinFET device.

2. The method of claim 1 wherein the forming the plurality of fins on the substrate comprises a process selected from a group consisting essentially of etching fins into a substrate and epitaxially growing fins on a substrate, and combinations thereof.

3. The method of claim 1 wherein the adjusting the thickness of the dielectric layer comprises:
   covering the first portion of the dielectric layer; and
   etching the uncovered second portion of the dielectric layer.

4. The method of claim 1 wherein the forming source and drain regions includes implanting dopants into the respective fins.

5. The method of claim 1, further comprising:
   forming a continuous second metal layer overlying the source drain regions of the plurality of fins, thereby forming a source drain region of the single finFET device, the finFET device comprising the plurality of fins.

6. A method of forming a device comprising:
   providing a plurality of fins on a substrate, a plurality of trenches, each disposed between adjacent ones of the plurality of fins;
   forming source and drain regions in the respective fins;
   forming a dielectric layer over the substrate and in the plurality of trenches;
   planarizing a top surface of the dielectric layer and a top surface of the plurality of fins, wherein the planarizing the top surface of the dielectric layer comprises removing a mask from the top surface of the plurality of fins and exposing the top surface of the plurality of fins;
   masking a first portion of the dielectric layer disposed in at least one of the plurality of trenches;
   performing a first etch on an unmasked second portion of the dielectric layer, the first etch reducing a height of the second portion of the dielectric layer below a height of the fins; and
   forming a continuous gate structure overlying the plurality of fins, the continuous gate structure being on a top surface of each fin and at least one sidewall surface of at least one fin, the continuous gate structure on a top surface of the second portion of the dielectric layer and a top surface of the first portion of the dielectric layer;
   wherein, after the forming the continuous gate structure, the first portion of the dielectric layer is in contact with a first sidewall of a first fin of the plurality of fins and has a top surface substantially co-planar with the top surface of the first fin; and
   wherein the second portion of the dielectric layer in contact with a second sidewall of the first fin opposite the first side, the first portion having a height different than a height of the second portion.

7. The method of claim 6 further comprising:
   performing a second etch on the second portion.

8. The method of claim 6 wherein the forming the plurality of fins comprises forming at least three fins.

9. The method of claim 8 wherein forming the continuous gate structure comprises forming the continuous gate structure on a portion of the first sidewall of the first fin, wherein the dielectric layer covers the second sidewall of the first fin.

10. The method of claim 9 wherein the forming the continuous gate structure further comprises forming the continuous gate structure on a portion of a first sidewall of a second fin of the plurality of fins, wherein the dielectric layer covers a second sidewall of the second fin, the second sidewall of the second fin opposite the first sidewall of the second fin.

11. The method of claim 10 wherein forming the continuous gate structure comprises forming the continuous gate structure on a top surface of a third fin of the plurality of fins, wherein the dielectric layer covers sidewalls of the third fin.

12. The method of claim 9 wherein forming the continuous gate structure further comprises forming the continuous gate structure on a portion of a first sidewall of a second fin of the plurality of fins and on a portion of a second sidewall of the second fin, the second sidewall of the second fin opposite the second sidewall of the second fin.

13. The method of claim 11, wherein the first portion of the dielectric layer is disposed between the first fin and the third fin, the first portion contacting a second sidewall of the third fin, a third portion of the dielectric layer contacting a first sidewall of the third fin and having a top surface about level with the top surface of the third fin.

14. The method of claim 11, wherein the first portion of the dielectric layer is disposed between the first fin and the third fin, the first portion contacting a second sidewall of the third fin, a third portion of the dielectric layer contacting a first sidewall of the third fin and having a top surface below the top surface of the third fin.

15. A method of forming a device comprising:
   providing a plurality of fins on a substrate, each fin of the plurality of fins having a sidewall, an upper portion of the sidewall being substantially orthogonal to a major surface of the substrate, and a lower portion of the sidewall being non-orthogonal to the major surface of the substrate;

forming a dielectric layer on the substrate between the plurality of fins, the dielectric layer having a first region at a first side of a first fin and contacting at least a portion of the upper portion of the sidewall of the first fin and further contacting at least a portion of the lower portion of the sidewall of the first fin, the dielectric layer having a second region at a second side of the first fin opposite the first side;

etching the second region to have a second thickness smaller than a first thickness of the first region;

forming, after forming the dielectric layer, source and drain regions in each of the plurality of fins;

forming a continuous gate structure overlying the plurality of fins and overlying the first region and the second region of the dielectric layer, the continuous gate structure over a top surface of each of the plurality of fins and at least one sidewall surface of at least one of the plurality of fins; and forming a continuous first metal layer overlying the source regions of the plurality of fins, thereby forming a source region of a single finFET device, the single finFET device comprising the plurality of fins, the continuous first metal layer and the continuous gate structure;

wherein, after the forming the continuous gate structure, the first region has a top surface coplanar with the top surface of the first fin.

16. The method of claim 15 wherein the etching comprises etching the second region, wherein the top surface of the second region is below the top surface of the first region.

17. The method of claim 15 wherein the etching comprises:
masking the first region with a mask; and
etching the second region after the masking the first region.

18. The method of claim 15 wherein the providing the plurality of fins comprises forming at least three fins, the first fin disposed between at least two other fins.

19. The method of claim 18 wherein the forming the dielectric layer comprises forming a third region of the dielectric layer disposed on an opposite side of each of the two other fins from the first fin.

20. The method of claim 15, further comprising:
forming, after the forming the dielectric layer, source and drain regions in each of the plurality of fins;
forming a continuous first metal layer overlying the source regions of the plurality of fins, thereby forming a source region of one finFET device, the finFET device comprising the plurality of fins; and
forming a continuous second metal layer overlying the drain regions of the plurality of fins, thereby forming a drain region of the single finFET device;
wherein the single finFET device further comprises the continuous second metal layer.

* * * * *